(12) United States Patent
Michaelis (10) Patent No.: US 12,100,791 B2
(45) Date of Patent: Sep. 24, 2024

(54) METHOD FOR PRODUCING A SEMICONDUCTOR COMPONENT HAVING AN INSULATING SUBSTRATE, AND SEMICONDUCTOR COMPONENT HAVING AN INSULATING SUBSTRATE

(71) Applicant: OSRAM OLED GmbH, Regensburg (DE)

(72) Inventor: Benjamin Michaelis, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 381 days.

(21) Appl. No.: 17/055,603

(22) PCT Filed: May 16, 2019

(86) PCT No.: PCT/EP2019/062707
§ 371 (c)(1),
(2) Date: Nov. 16, 2020

(87) PCT Pub. No.: WO2019/219859
PCT Pub. Date: Nov. 21, 2019

(65) Prior Publication Data
US 2021/0226108 A1 Jul. 22, 2021

(30) Foreign Application Priority Data
May 17, 2018 (DE) .................... 10 2018 111 954.2

(51) Int. Cl.
*H01L 33/62* (2010.01)
*H01L 31/02* (2006.01)
*H01L 33/60* (2010.01)

(52) U.S. Cl.
CPC ........ *H01L 33/62* (2013.01); *H01L 31/02002* (2013.01); *H01L 33/60* (2013.01); *H01L 2933/0066* (2013.01)

(58) Field of Classification Search
CPC ... H01L 23/12; H01L 23/15; H01L 21/02016; H01L 21/30625; H01L 21/31057;
(Continued)

(56) References Cited

U.S. PATENT DOCUMENTS

2003/0077847 A1 * 4/2003 Yoo .................. H01L 33/60
257/E33.068
2007/0096116 A1    5/2007 Yasuda
(Continued)

FOREIGN PATENT DOCUMENTS

EP    2533313 A2    12/2012
JP    2002368261 A * 12/2002
(Continued)

OTHER PUBLICATIONS

JP-2002368261-A English translation.*
(Continued)

*Primary Examiner* — Latanya N Crawford Eason
(74) *Attorney, Agent, or Firm* — VIERING, JENTSCHURA & PARTNER mbB (57) ABSTRACT

A method for producing a semiconductor component may include applying a semiconductor chip over a first main surface of an insulating substrate, thinning a second main surface of the insulating substrate where the second main surface has a roughness of more than 300 nm after thinning, applying a smoothing metal layer over the second main surface of the insulating substrate, and smoothing the smoothing metal layer. A semiconductor component may include a semiconductor chip, an insulating substrate where the semiconductor chip is arranged over a first main surface of the insulating substrate and a second main surface of the insulating substrate has a roughness Ra of more than 300 nm, and a smoothing metal layer over the second main surface.

17 Claims, 6 Drawing Sheets

(58) Field of Classification Search
CPC ............... H01L 21/02013; H01L 33/62; H01L 2933/0066; H01L 33/22; H01L 33/46; H01L 33/58; H01L 33/60; H01L 25/0655; H01L 25/0753; H01L 25/167; H01L 31/02002; C23C 14/028; C23C 16/0254
See application file for complete search history.

(56) References Cited

U.S. PATENT DOCUMENTS

| | | | | |
|---|---|---|---|---|
| 2012/0288698 | A1* | 11/2012 | Moldovan | H01L 23/3732 428/141 |
| 2014/0203318 | A1* | 7/2014 | Matsui | H01L 33/60 257/98 |
| 2015/0029725 | A1 | 1/2015 | Kamikawa | |
| 2015/0171024 | A1 | 6/2015 | Choi et al. | |
| 2015/0333217 | A1 | 11/2015 | Yoo | |
| 2016/0308101 | A1* | 10/2016 | Konishi | H01L 33/62 |
| 2018/0096952 | A1* | 4/2018 | Miccoli | H01L 23/562 |
| 2020/0381592 | A1* | 12/2020 | Itakura | H01L 23/13 |

FOREIGN PATENT DOCUMENTS

| | | | |
|---|---|---|---|
| JP | 2008141015 A | * | 6/2008 |
| WO | 2011072976 A1 | | 6/2011 |

OTHER PUBLICATIONS

JP-2008141015-A English translation.*
International Search Report issued for the corresponding International Application No. PCT/EP2019/062707 mailed on Sep. 2, 2019, 12 Pages (For referential purposes only).
Office Action issued for the corresponding German Patent Application No. 10 2018 111 954.2 dated Oct. 31, 2018, 5 Pages (For referential purposes only).

* cited by examiner

METHOD FOR PRODUCING A SEMICONDUCTOR COMPONENT HAVING AN INSULATING SUBSTRATE, AND SEMICONDUCTOR COMPONENT HAVING AN INSULATING SUBSTRATE

CROSS-REFERENCE TO RELATED APPLICATIONS

The present application is a national stage entry according to 35 U.S.C. § 371 of PCT application No.: PCT/EP2019/062707 filed on May 16, 2019; which claims priority to German Patent Application Serial No.: 10 2018 111 954.2 filed on May 17, 2018; all of which are incorporated herein by reference in their entirety and for all purposes.

TECHNICAL FIELD

A semiconductor component may have a first main surface and a second main surface where the second main surface has a roughness of more than 300 nm after being thinned, and more specifically pertains to optoelectronic semiconductor chips.

BACKGROUND

Semiconductor components such as optoelectronic components, for example, are usually produced by applying and structuring various layers on a substrate, for example on a monocrystalline substrate composed of an insulating or semiconductor material. By way of example, further monocrystalline semiconductor layers are grown epitaxially on a monocrystalline substrate and subsequently structured, if appropriate. Furthermore, additional layers, for example insulating or conductive layers, are applied and structured. Process steps of this type are usually carried out at the wafer level. The wafer is then singulated into individual semiconductor chips. The individual chips are then applied to suitable carrier structures and electrically contacted, for example. Endeavors are made to further improve these processes at the end of the development process.

SUMMARY

In accordance with embodiments, a method for producing a semiconductor component includes applying a semiconductor chip over a first main surface of an insulating substrate, thinning a second main surface of the insulating substrate, applying a smoothing metal layer over the second main surface of the insulating substrate, and smoothing the smoothing metal layer.

By way of example, the smoothing metal layer can be structured after smoothing. However, it can also be applied in an already structured manner—for example by means of a lift-off process. The method can furthermore include applying a contact metal layer over the smoothing metal layer. By way of example, component parts of the semiconductor chip can be electrically connected via the contact metal layer. In accordance with further embodiments, however, the smoothing metal layer can also be used as a contact metal layer; that is to say that component parts of the semiconductor chip can be electrically connected via the smoothing metal layer.

The method can furthermore include structuring the contact metal layer. In accordance with embodiments, the structured contact metal layer can be used as an etching mask for etching the smoothing metal layer.

In the method, for example, a multiplicity of semiconductor chips can be applied in a manner spaced apart laterally on the insulating substrate. The method can furthermore include singulating a layer composite including a semiconductor chip, insulating substrate, smoothing metal layer and contact metal layer.

By way of example, the singulating can be carried out after structuring the contact metal layer.

The substrate can be selected from SiN, AlN, NbO, MgO or a combination of these materials. The smoothing metal can be for example one which is better able to be smoothed than the substrate material. Examples encompass, inter alia, titanium, nickel, aluminum, a combination of these metals and others. The contact metal can contain gold, platinum, tin, titanium and any other metals desired.

By way of example, the semiconductor chip is an optoelectronic semiconductor chip.

In accordance with embodiments, a semiconductor component includes a semiconductor chip and an insulating substrate. The semiconductor chip is arranged over a first main surface of the insulating substrate. A second main surface of the insulating substrate has a roughness Ra of more than 300 nm. The semiconductor component furthermore includes a smoothing metal layer over the second main surface.

The semiconductor component can furthermore include a contact metal layer over the smoothing metal layer.

The roughness of a first main surface of the smoothing metal layer facing away from the insulating substrate can be less than the roughness of the second main surface of the insulating substrate.

The insulating substrate can be selected from SiN, AlN, NbO, MgO or a combination of these materials. The smoothing metal can be selected as explained above. The contact metal can contain gold, platinum, tin, titanium and any other metals desired.

By way of example, the horizontal extent of the smoothing metal layer can be smaller than a horizontal extent of the insulating substrate.

In accordance with embodiments, the semiconductor chip can be an optoelectronic semiconductor chip. In accordance with embodiments, an optoelectronic device includes the semiconductor component described.

BRIEF DESCRIPTION OF THE DRAWINGS

The accompanying drawings serve to afford an understanding of embodiments. The drawings illustrate embodiments and together with the description serve to elucidate same. Further embodiments and numerous advantages from among those intended are evident directly from the following detailed description.

The elements and structures shown in the drawings are not necessarily illustrated in a manner true to scale with respect to one another. Identical reference signs refer to identical or mutually corresponding elements and structures.

DETAILED DESCRIPTION

In the following detailed description, reference is made to the accompanying drawings, which form part of the disclosure and show specific embodiments for illustration purposes. In this context, a direction terminology such as "top side", "bottom", "front side", "rear side", "over", "on", "in front of", "behind", "at the front", "at the back", etc. relates to the orientation of the figures currently being described. Since the component parts of the embodiments can be positioned in different orientations, the direction terminology serves only for elucidation and is not restrictive in any way.

The description of the embodiments is not restrictive since other embodiments also exist and structural or logical changes can be made, without in that case departing from the scope defined by the patent claims. In particular, elements of embodiments described below can be combined with elements of other embodiments from among those described, provided that nothing to the contrary is evident from the context.

The terms "wafer" or "semiconductor substrate" used in the following description can encompass any semiconductor-based structure having a semiconductor surface. Wafer and structure should be understood as including doped and undoped semiconductors, epitaxial semiconductor layers, if appropriate carried by a base support, and further semiconductor structures. By way of example, a layer composed of a first semiconductor material can be grown on a growth substrate composed of a second semiconductor material or composed of an insulating material, for example in a sapphire substrate. Depending on the purpose of use, the semiconductor can be based on a direct or an indirect semiconductor material. Examples of semiconductor materials that are particularly suitable for generating electromagnetic radiation encompass, in particular, nitride semiconductor components, which can generate ultraviolet light, blue light or light of longer wavelength, for example, such as GaN, InGaN, AlN, AlGaN, AlGaInN, for example, phosphide semiconductor compounds, which can generate green light or light of longer wavelength, for example, such as GaAsP, AlGaInP, GaP, AlGaP, for example, and further semiconductor materials such as AlGaAs, SiC, ZnSe, GaAs, ZnO, $Ga_2O_3$, diamond, hexagonal BN and combinations of the materials mentioned. The stoichiometric ratio of the ternary compounds can vary. Further examples of semiconductor materials can encompass silicon, silicon-germanium and germanium. In the context of the present description, the term "semiconductor" also includes organic semiconductor materials.

The term "substrate" encompasses insulating or semiconductor substrates. By way of example, a substrate can represent a monocrystalline base element on which further layers can be grown epitaxially, for example. Specific examples of substrate materials encompass sapphire, GaAs, GaN, GaP, silicon, SiC and others. In accordance with further embodiments, a substrate, which can be polycrystalline and insulating, for example, serves as a carrier element on which semiconductor chips are applied.

The terms "lateral" and "horizontal", as used in this description, are intended to describe an orientation or alignment which extends substantially parallel to a first surface of a substrate or semiconductor body. This can be the surface of a wafer or of a die or of a chip, for example.

The term "vertical", as used in this description, is intended to describe an orientation which extends substantially perpendicular to the first surface of a substrate or semiconductor body.

Insofar as the terms "have", "contain", "encompass", "include" and the like are used, there are open terms which indicate the presence of the stated elements or features, but do not exclude the presence of further elements or features. The indefinite articles and the definite articles encompass both the plural and the singular, provided that something to the contrary is not clearly evident from the context.

In the context of this description, the term "electrically connected" denotes a low-resistance electrical connection between the connected elements. The electrically connected elements need not necessarily be directly connected to one another. Further elements can be arranged between electrically connected elements.

The term "electrically connected" also encompasses tunnel contacts between the connected elements.

Generally, the term "dielectric mirror layer" encompasses any arrangement which reflects incident electromagnetic radiation to a large degree (>90%) and is not conductive. By way of example, a dielectric mirror layer can be formed by a sequence of very thin dielectric layers, each having different refractive indices. By way of example, the layers can alternately have a high refractive index (n>1.7), and a low refractive index (n<1.7), and be embodied as a Bragg reflector. By way of example, the layer thickness can be λ/4, wherein λ indicates the wavelength of the light to be reflected. The layer as viewed from the incident light can have a larger layer thickness, for example 3λ/4. On account of the small layer thickness and the difference in the respective refractive indices, the dielectric mirror layer provides a high reflectivity and at the same time is not conductive.

Figure 1A:
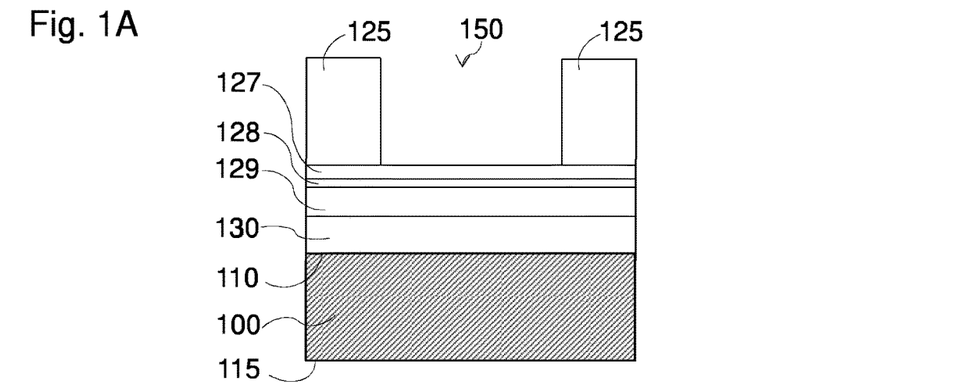
FIGS. 1A to 1F schematically show cross-sectional views of a workpiece when carrying out a method for producing a semiconductor component in accordance with embodiments.

FIG. 1A shows a cross-sectional view of a workpiece 150 when carrying out a method in accordance with embodiments. A multiplicity of semiconductor chips 125 are applied over a first main surface 110 of an insulating substrate 100. The semiconductor chips 125 can be constructed in any desired manner and fulfill any desired functions. In accordance with embodiments, the semiconductor chips 125 can be optoelectronic semiconductor chips. By way of example, they can be suitable for emitting or absorbing light. By way of example, they can generate photons when a certain voltage is applied. Conversely, they can generate a current upon irradiation with photons.

In order to produce the semiconductor chips 125, various semiconductor layers may have been grown on a growth substrate, for example composed of GaAs, as a result of which a layer stack has been produced. In accordance with further implementations, for the further processing of the layer stack, additional layers, for example insulating or conductive layers, may have been applied and structured. By way of example, the semiconductor chips 125 may have been detached from a growth substrate. The layer stack produced may have been singulated to form individual semiconductor chips 125, for example before or after detachment of the growth substrate.

The individual semiconductor chips 125 can be connected to the insulating substrate 100 by way of the first main surface 110 by means of various layers. By way of example, the insulating substrate 100 can be constructed from silicon nitride (SiN), aluminum nitride (AlN), niobium oxide (NbO), magnesium oxide (MgO) or others or can contain these materials. Generally, insulating substrates of this type are polycrystalline, for example, wherein the corresponding insulating material is arranged in each case as filling material between the individual crystals. Accordingly, it is difficult to obtain a smooth surface 120 of the insulating substrate after grinding of the insulating substrate.

By way of example, the substrate 100 can be connected to a metallization layer 129 by means of a solder metal layer 130. The solder metal layer 130 can contain for example AuSn, AuInSn, NiInSn, NiSn with barrier and adhesion layers composed of e.g. Pt or Ti. By way of example, the metallization layer can be suitable for connecting or contacting a doped semiconductor layer, for example a p-doped semiconductor layer of the semiconductor chip 125. Furthermore, a dielectric layer 127 can be applied over the metallization layer 129. By way of example, the dielectric layer 127 can be a dielectric mirror layer that brings about reflection of the electromagnetic radiation generated by the semiconductor chip 125. If appropriate, a transparent conductive layer 129, for example composed of ITO, can furthermore be arranged between the metallization layer 129 and the dielectric layer 127. The transparent conductive layer 129 can also be omitted.

Figure 1B:
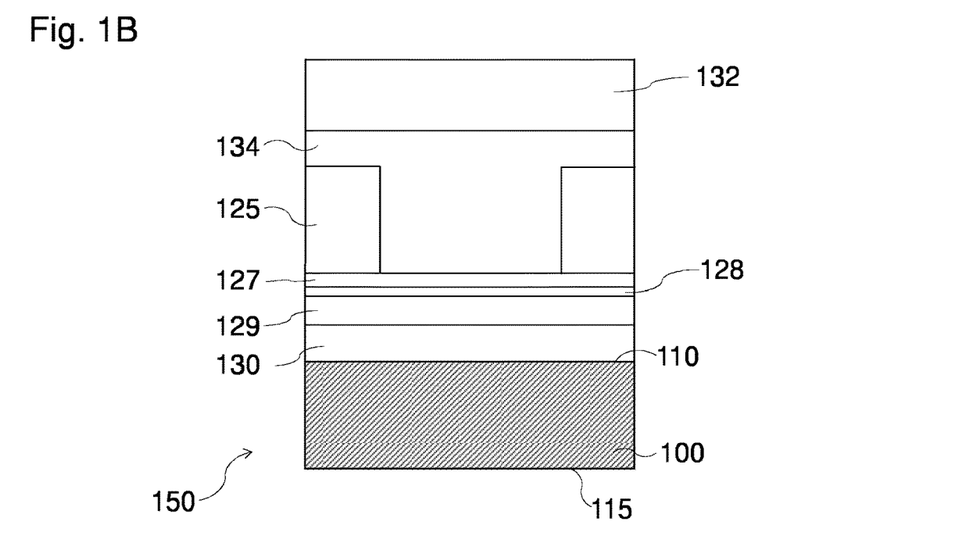

In a next step, a carrier 132 is applied over the side of the workpiece 150 facing away from the second main surface 115 of the substrate 100. The carrier 132 can be for example a hard carrier, for example composed of glass, sapphire or some other transparent material. It can be connected to the workpiece 150 by means of an adhesive layer, for example a resist material 134. In accordance with further configurations, the carrier 132 can also be connected to the workpiece by means of some other material such as BCB (benzocyclobutene) or a thermal release film. FIG. 1B shows a cross-sectional view of a resulting workpiece 150 with applied carrier 132.

The insulating substrate 100 is then thinned. By way of example, the substrate 100 can be ground to a thickness of 150 µm or thinner. The substrate is usually ground mechanically. By way of example, an etching method can additionally be carried out in order to remove the damage—produced in the course of grinding—to the resulting second main surface 120 of the insulating substrate 100. Small cracks usually arise during grinding, which reduce the surface tension and thus foster a curvature of the substrate. Said cracks can be removed by etching.

After this etching method has been carried out, the second main surface 120 of the substrate has a roughness value $R_a$ of for example more than 0.3 µm, for example more than 0.5 µm, for example up to a roughness of up to more than 2 µm, for example up to 5 µm. This roughness value relates to the average roughness $R_a$, indicating the average distance z between a measurement point $(x_m, y_n)$ on the surface and a center line $\langle z \rangle$. In this case, the center line intersects the real profile within the reference path such that the sum of the profile deviation (relative to the center line) becomes minimal. This is also illustrated below with reference to FIG. 3B. By way of example, the average roughness $R_a$ corresponds to the arithmetic mean of the deviation in terms of absolute value from the center line 121 (illustrated in FIG. 3B). By way of example, it can be calculated in two dimensions from:

$$Ra = \frac{1}{MN} \sum_{m=1}^{N} \sum_{n=1}^{N} |z(x_m, y_n) - \langle z \rangle| \text{ where}$$

-continued $$\langle z \rangle = \frac{1}{MN} \sum_{m=1}^{N} \sum_{n=1}^{N} z(x_m, y_n).$$

Figure 1C:
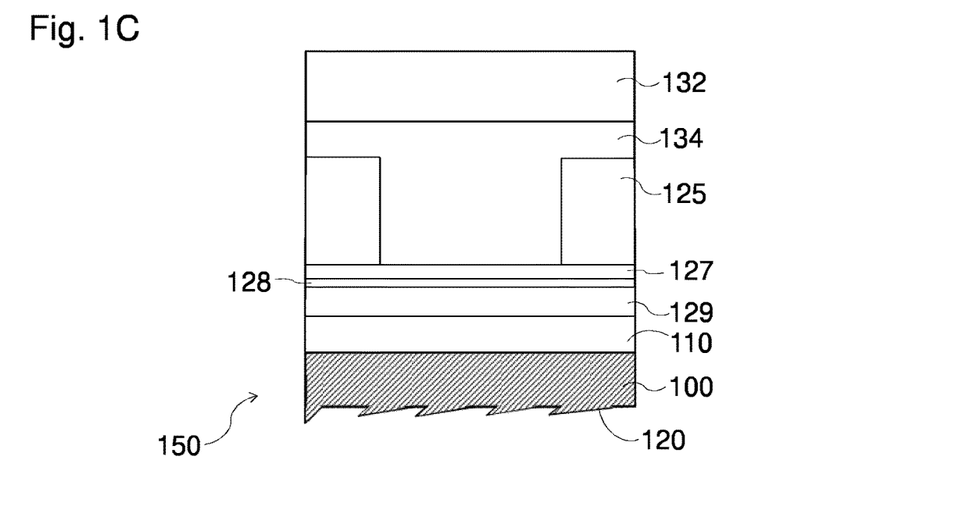

FIG. 1C shows a cross-sectional view of a resulting workpiece. A smoothing metal layer is then applied over the second main surface 120 of the insulating substrate 100. By way of example, applying a smoothing metal layer 135 can include applying an adhesion promoting layer and also a metal layer. By way of example, the adhesion promoter can include titanium with a layer thickness of 10 to 50 nm, for example 15 to 25, for example 20 nm. Nickel or one of the metals mentioned above can be applied as smoothing metal layer. By way of example, the smoothing metal layer can have a layer thickness of 0.5 to 10 µm, for example more than 1 µm. The layer thickness of the smoothing metal layer 135 can be less than 2.5 µm. The thickness of the smoothing metal layer 135 can be selected in such a way that it corresponds approximately to double the roughness of the insulating substrate. A CMP ("chemical mechanical polishing") method is then carried out for polishing the smoothing metal layer 135.

Figure 1D:
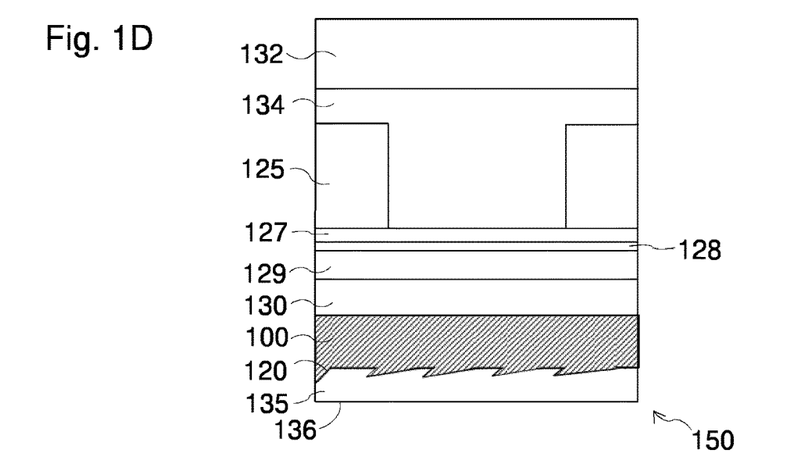

FIG. 1D shows a cross-sectional view of a resulting workpiece. As is shown, the rear side or exposed surface 136 of the smoothing metal layer 135 is significantly less rough than the second main surface 120 of the insulating substrate. In accordance with embodiments, a contact metal layer 140 can be subsequently applied over the smoothing metal layer 135. The contact metal layer 140 can be applied in a structured manner by means of a lift-off method, for example. By way of example, for this purpose, a photoresist material is suitably structured, such that it is present at the locations on which the contact metal layer is not to be formed. The contact metal layer 140 is then applied over the whole area. The photoresist material is dissolved in a suitable solvent, as a result of which the contact metal layer 140 is removed from the locations at which the photoresist material was previously present. Alternatively, the contact metal layer 140 can also be structured by means of other methods, for example by means of a photolithographic method.

By way of example, the contact metal layer 140 can contain a layer sequence including Pt (platinum), Au (gold), Sn (tin), Ti (titanium) and gold as termination. The contact metal layer enables the contacting of the LED chip, for example, by means of a bonding method. After the etching of the contact metallization, the structured contact metal layer 140 can be used as an etching mask for etching the underlying smoothing metal layer 135. It is also possible to define an etching trench, for example in a photoresist material, in a further photolithographic method. Said etching trench can be smaller, for example, than the trench produced in the contact metal layer 140.

In principle, all conceivable metal combinations can be selected as contact metal and as smoothing metal and, if appropriate, adhesion promoting layer for the smoothing metal. The contact metal can also be omitted, and the smoothing metal can be used as contact metal.

If the structured contact metal layer 140 is used as an etching mask for etching the smoothing metal layer, then the contact metal should be different from the smoothing metal and, if appropriate, the adhesion promoting layer and a largely selective etching method should be possible. To put it more precisely, the contact metal layer should not be etched, or should be etched only a little, during the etching of the smoothing metal or the adhesion promoting layer.

Figure 1E:
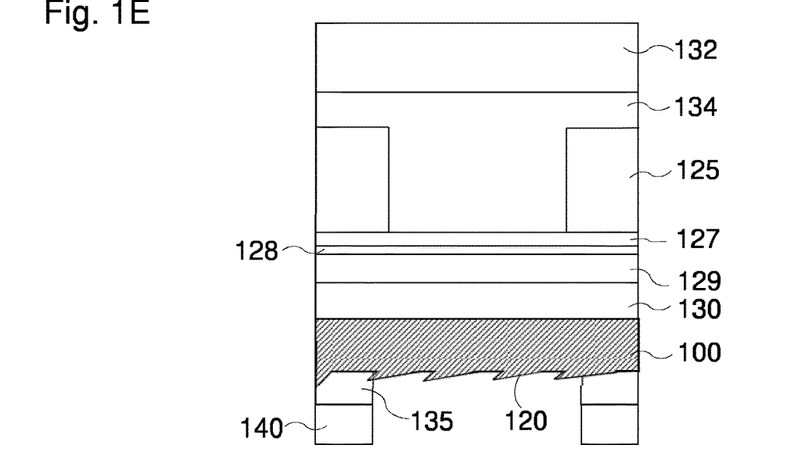

FIG. 1E shows a cross-sectional view of a resulting workpiece. As is illustrated, a part of the smoothing metal layer is arranged in each case in the region below the semiconductor chips 125. The method can furthermore include structuring the contact metal layer. In accordance with embodiments, a part of the contact metal layer can also be arranged in the region below the semiconductor chips 125. The metal layers on the second main surface 120 of the substrate 100 are removed in a region between adjacent semiconductor chips 125.

Afterward, adjacent semiconductor components 10 can be singulated by means of a singulating process. By way of example, for the purpose of singulating, the workpiece is applied to a specific processing film (not illustrated). A laser can be used to separate the stack including insulating substrate 100, connecting layer 130, metallization 129 and dielectric layer 127 from one another. By virtue of the fact that the metallization layers on the rear side 120 of the insulating substrate 100 are removed in the region between adjacent semiconductor chips 125, it is possible to avoid short circuits as a result of metallic materials in the vicinity of the separating region 20 of the semiconductor components 10.

Figure 1F:
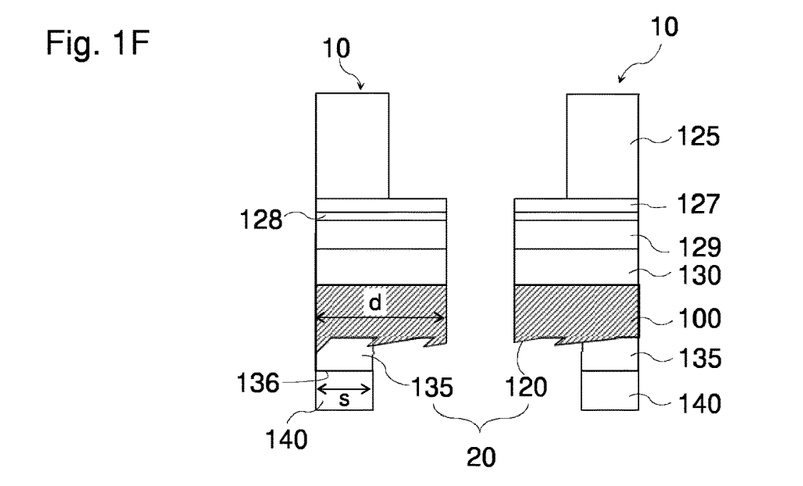

FIG. 1F shows a schematic cross-sectional view of semiconductor components after carrying out the described singulating process in accordance with embodiments. The semiconductor component will be described in greater detail with reference to FIGS. 3A and 3B.

Proceeding from the workpiece in FIG. 1C, in accordance with embodiments the method can be continued in such a way that the smoothing metal layer 135 is applied in an already structured manner. By way of example, a photoresist material can be applied to the second main surface of the substrate. The photoresist material can be structured in such a way that the central region of the workpiece, that is to say in particular a part between adjacent semiconductor chips 125, is covered with the photoresist layer. Locations at which the smoothing metal layer 135 is to be formed are not covered with the photoresist layer. Afterward, the material of the smoothing metal layer 135 is deposited. By way of example, the thickness of the smoothing metal layer 135 corresponds approximately to double the roughness. The roughness of the substrate is transferred approximately into the smoothing metal. That part of the smoothing metal layer 135 which is arranged over the photoresist layer is removed by means of a lift-off process. Afterward, a CMP method is carried out for smoothing the first main surface 136 of the smoothing metal layer.

Figure 2A:
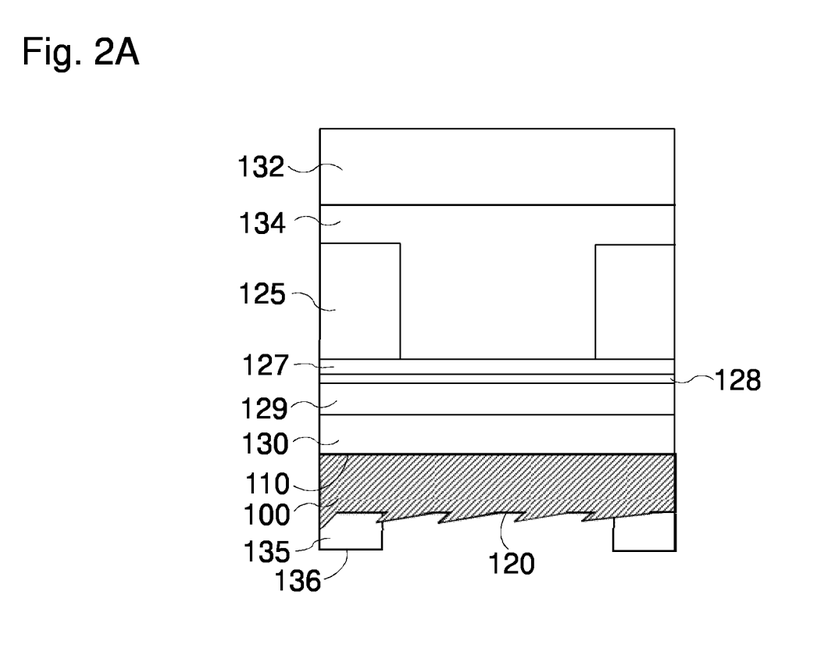
FIGS. 2A and 2B show variants of the method shown in FIGS. 1A to 1F.
Figure 2B:
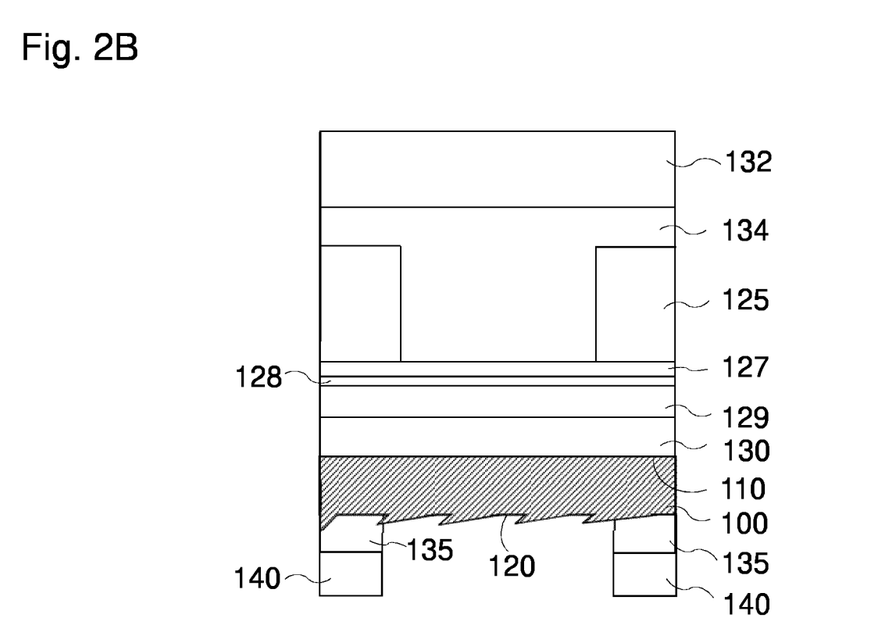

FIG. 2A shows a cross-sectional view of a resulting workpiece. Afterward, the contact metallization layer 140 is applied in a structured manner by means of a similar lift-off process. Afterward, the individual semiconductor components are singulated, for example by means of laser dicing, or by means of scribing using a laser and mechanical breaking. The carrier and the adhesive layer 134 are then removed from the semiconductor component.

Figure 3A:
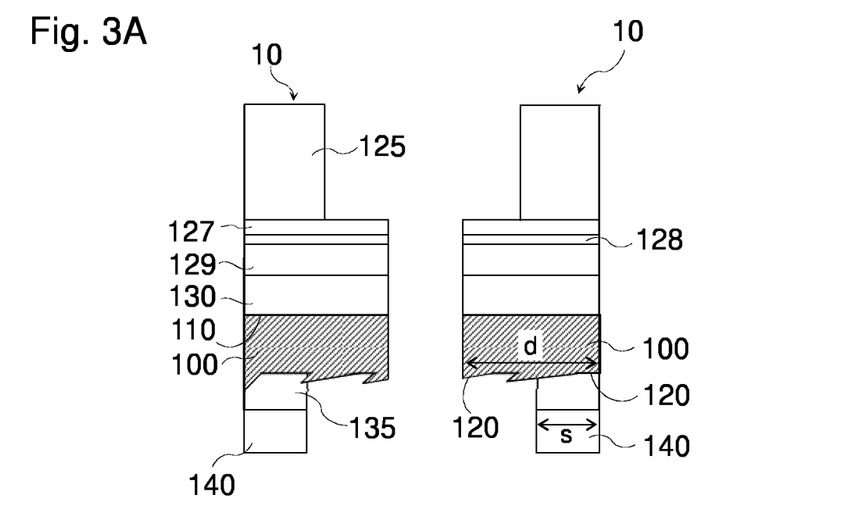
FIG. 3A shows cross-sectional views through a semiconductor component in accordance with embodiments.
Figure 3B:
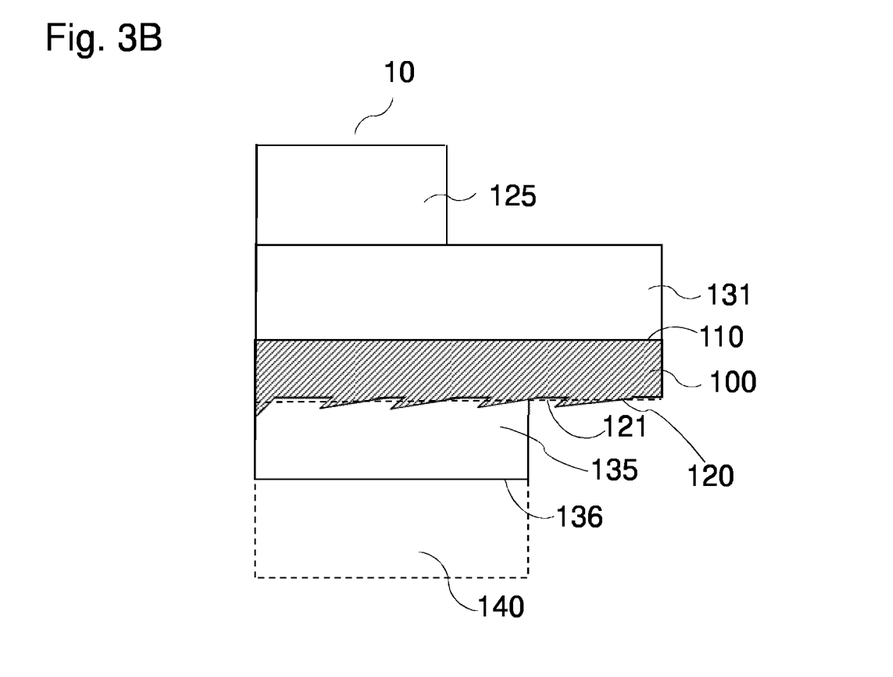
FIG. 3B is a schematic cross-sectional view for elucidating features of a semiconductor component in accordance with embodiments.

FIG. 3A shows a cross-sectional view of resulting semiconductor components 10. The semiconductor component 10 includes a semiconductor chip 125 and an insulating substrate 100. The semiconductor chip 125 is arranged over a first main surface 110 of an insulating substrate 100. A second main surface 120 of the insulating substrate has a roughness $R_a$ of more than 300 nm. A smoothing metal layer 135 is arranged over the second main surface 120. A contact metal layer 140 can be arranged over the smoothing metal layer 135. By way of example, a lateral extent s of the smoothing metal layer and, if appropriate, of the contact metal layer is smaller than a lateral extent d of the insulating substrate 100.

FIG. 3B shows a schematic cross-sectional view of the semiconductor component. A semiconductor chip 125 is connected to a first main surface of an insulating substrate 100 by means of a layer stack 131, which can be constructed as in FIG. 3A, for example. A smoothing metal layer 135 is arranged in a manner adjoining the second main surface 120 of the insulating substrate 100. In accordance with embodiments, a contact metal layer 140 is arranged in a manner adjoining the side of the smoothing metal layer 135 facing away from the substrate 100. As can be seen, the roughness of the second main surface 136 of the smoothing metal layer 135 is less than the roughness of the second main surface 120 of the substrate 100. The dashed line 121 designates the center line of the rough surface 120. The smoothing metal layer 135 can additionally perform the function of the contact metal layer 140. The contact metal layer 140 is thus optional.

Figure 4:
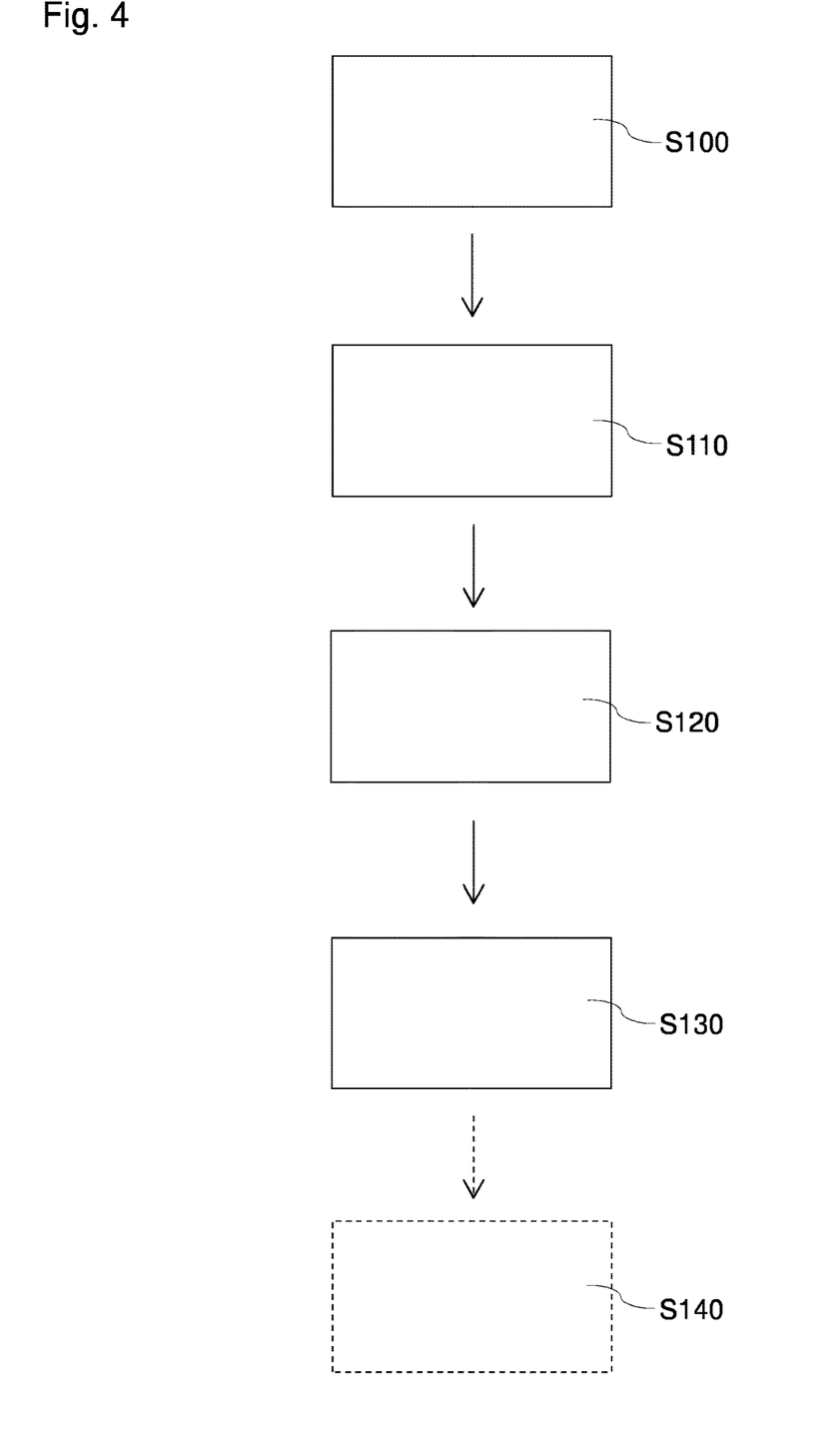
FIG. 4 summarizes a method in accordance with embodiments.

FIG. 4 summarizes a method in accordance with embodiments. A method for producing a semiconductor component includes applying (S100) a semiconductor chip of a first main surface of an insulating substrate, thinning (S110) a second main surface of the insulating substrate, applying (S120) a smoothing metal layer over the second main surface of the insulating substrate, and smoothing (S130) the smoothing metal layer. The method can optionally also include applying (S140) a contact metal layer over the smoothing metal layer.

As has been described, in accordance with embodiments, the first main surface 136 of the smoothing metal layer 135 is smoothed, instead of the second main surface 120 of the insulating substrate 100, in order to obtain a smooth working surface. A high smoothness of the layer composite including semiconductor chip, insulating substrate, smoothing metal layer and, if appropriate, contact metal layer can be obtained as a result. It is thereby possible to improve, for example, adhesion to a processing film for singulating and processing the singulated chips. Furthermore, the semiconductor component can be bonded in a better way, which results in improved heat transfer from the chip into the substrate.

The process sequence described in largely independent of the constitution of the insulating substrate. In contrast to direct smoothing of the substrate, in which the material parameters of the substrate are crucial for establishing the extent to which the surface can be smoothed, the material parameters of the smoothing metal are now crucial. The substrate material can thereby be modified with minimal outlay. Examples of the smoothing metal encompass, inter alia, Ti, Ni or Al or a combination of these materials. With the use of smoothing metals, it is possible to use established processes for smoothing. As a consequence, there is no need to develop novel processes for smoothing the carrier. This results in an enormous cost saving. In accordance with embodiments, in principle any metal which has better smoothability than the insulating substrate can be used as smoothing metal.

By virtue of the fact that, in accordance with embodiments, an additional structuring of the smoothing metal layer 135 and of the contact metal layer 140 is carried out, it is possible for the region in which the semiconductor components are to be singulated later to be kept free of metal. As a consequence, short circuits across the insulating substrate 100 are avoided after the singulating process.

The layer thickness of the smoothing metal layer 135 is selected in each case depending on the insulating substrate.

To put it more precisely, depending on the constitution of the substrate, the exposed surface of the thinned substrate can have a different roughness. Depending on the roughness of the exposed surface of the substrate, the layer thickness of the smoothing metal layer 135 is increased or decreased in order to enable a lower/higher polishing removal.

Figure 5:
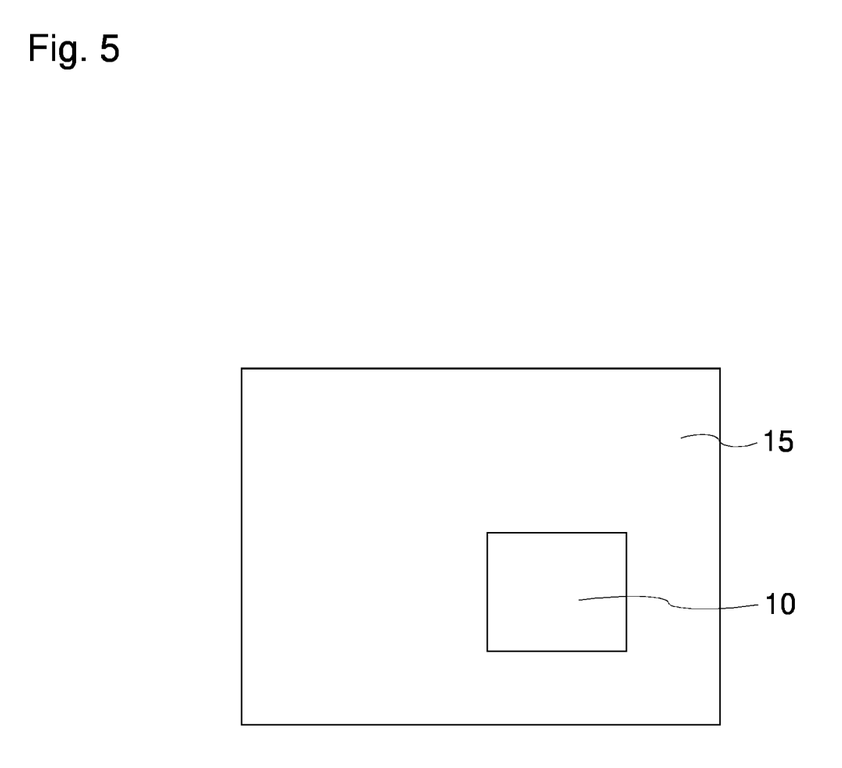
FIG. 5 shows a schematic view of an optoelectronic device in accordance with embodiments.

FIG. 5 shows a schematic view of an optoelectronic device in accordance with embodiments. The optoelectronic device 15 includes the semiconductor component 10 as described above. By way of example, the optoelectronic device can contain a series circuit formed by semiconductor components in accordance with embodiments. Accordingly, the optoelectronic device can withstand a high voltage. Particular applications encompass projectors, for example also for the lighting of stages.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed therein. Therefore, the invention is restricted only by the claims and the equivalents thereof.

LIST OF REFERENCE SIGNS

10 Semiconductor component
15 Optoelectronic device
20 Separating region
100 Substrate
110 First main surface of the substrate
115 Second main surface before thinning
120 Second main surface after thinning
121 Center line
125 Semiconductor chip
127 Dielectric layer
128 Transparent conductive layer
129 Metallization
130 Connecting layer
132 Carrier
134 Adhesive
135 Smoothing metal layer
136 First main surface of the smoothing metal layer
140 Contact metal layer
150 Workpiece

The invention claimed is:

1. A method for producing a semiconductor component, wherein the method comprises:
applying a plurality of semiconductor chips over a first main surface of an insulating substrate where the plurality of semiconductor chips are spaced apart laterally on the insulating substrate; wherein the insulating substrate is selected from the group consisting of SiN, AlN, NbO, MgO, or a combination thereof,
thinning a second main surface of the insulating substrate, wherein the second main surface has a roughness of more than 300 nm after thinning;
applying a smoothing metal layer over the second main surface of the insulating substrate;
smoothing the smoothing metal layer; and
applying a contact metal layer over the smoothing metal layer and patterning the contact metal layer.

2. The method as claimed in claim 1, wherein the smoothing metal layer is structured after smoothing.

3. The method as claimed in claim 1, wherein the structured contact metal layer is used as an etching mask for etching the smoothing metal layer.

4. The method as claimed in claim 1, wherein the smoothing metal is selected from the group consisting of titanium, nickel, aluminum, a combination thereof.

5. The method as claimed in claim 1, wherein the contact metal comprises one or more of gold, platinum, tin, titanium, or combinations thereof.

6. The method as claimed in claim 1, wherein the semiconductor chip is an optoelectronic semiconductor chip.

7. The method as claimed in claim 1, further comprising singulating a layer composite comprising a semiconductor chip of the plurality of semiconductor chips, the insulating substrate, and the smoothing metal layer.

8. The method as claimed in claim 7, wherein the singulating is carried out after structuring the smoothing metal layer.

9. The method as claimed in claim 1, wherein a thickness of the smoothing metal layer is approximately double the thickness of the roughening of the second main surface of the insulating substrate.

10. A semiconductor component comprising:
a semiconductor chip;
an insulating substrate, wherein the semiconductor chip is arranged over a first main surface of the insulating substrate and a second main surface of the insulating substrate has a roughness Ra of more than 300 nm; wherein the insulating substrate is selected from the group consisting of SiN, AlN, NbO, MgO, or a combination thereof,
a smoothing metal layer over the second main surface; wherein a horizontal extent of the smoothing metal layer is smaller than a horizontal extent of the insulating substrate; and
a patterned contact metal disposed over the smoothing metal layer.

11. The semiconductor component as claimed in claim 10, wherein the roughness of a first main surface of the smoothing metal layer facing away from the insulating substrate is less than the roughness of the second main surface of the insulating substrate.

12. The semiconductor component as claimed in claim 10, wherein the smoothing metal is selected from the group consisting of titanium, nickel, aluminum, or a combination thereof.

13. The semiconductor component as claimed in claim 10, wherein the contact metal layer comprising one or more of gold, platinum, tin, titanium, or combinations thereof.

14. The semiconductor component as claimed in claim 10, wherein the semiconductor chip is an optoelectronic semiconductor chip.

15. An optoelectronic device comprising the semiconductor component as claimed in claim 14.

16. The semiconductor component as claimed in claim 10, wherein a thickness of the smoothing metal layer is approximately double the thickness of the roughening of the second main surface of the insulating substrate.

17. A method for producing a semiconductor component, wherein the method comprises:
applying a semiconductor chip over a first main surface of an insulating substrate;
after applying the semiconductor chip, thinning a second main surface of the insulating substrate, wherein the second main surface has a roughness of more than 300 nm after thinning;

applying a smoothing metal layer over the second main surface of the insulating substrate; and smoothing the smoothing metal layer; wherein a thickness of the smoothing metal layer is approximately double the thickness of the roughening of the second main surface of the insulating substrate.

\* \* \* \* \*